United States Patent
Randall et al.

(10) Patent No.: US 6,634,018 B2
(45) Date of Patent: Oct. 14, 2003

(54) OPTICAL PROXIMITY CORRECTION

(75) Inventors: John N. Randall, Richardson, TX (US); Thomas J. Aton, Dallas, TX (US); Shane R. Palmer, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 09/935,452

(22) Filed: Aug. 23, 2001

(65) Prior Publication Data

US 2002/0026626 A1 Feb. 28, 2002

Related U.S. Application Data

(60) Provisional application No. 60/227,488, filed on Aug. 24, 2000.

(51) Int. Cl.[7] .............................................. G06F 17/50
(52) U.S. Cl. ............................ 716/19; 716/20; 716/21
(58) Field of Search ....................... 716/19–21; 430/30, 430/296, 322, 5; 703/22, 14; 700/121

(56) References Cited

U.S. PATENT DOCUMENTS

| | | |
|---|---|---|
| 5,663,017 A | 9/1997 | Schinella et al. |
| 5,723,233 A | 3/1998 | Garza et al. |
| 5,740,068 A | 4/1998 | Liebmann et al. |
| 5,858,591 A | 1/1999 | Lin et al. |
| 5,862,058 A | 1/1999 | Samuels et al. |
| 5,879,844 A | 3/1999 | Yamamoto et al. |
| 5,962,173 A | 10/1999 | Leroux et al. |
| 6,016,201 A | 1/2000 | Lin et al. |
| 6,033,814 A * | 3/2000 | Burdorf et al. ............... 430/30 |

* cited by examiner

*Primary Examiner*—Vuthe Siek
*Assistant Examiner*—Naum Levin
(74) *Attorney, Agent, or Firm*—Peter K. McLarty; W. James Brady, III; Frederick J. Telecky, Jr.

(57) ABSTRACT

An improvement to the optical proximity correction process used in photolithography. Mask pattern modeling is added to the optical proximity correction process, producing patterns that are optimized for both reticle manufacture and wafer fabrication. Pattern validation is improved by applying a mask pattern model and a wafer pattern model to the validation process. Reticle inspection is improved by adding a mask inspection tool model that comprehends the limitations of the inspection tool.

15 Claims, 3 Drawing Sheets

OPTICAL PROXIMITY CORRECTION

This application claims priority under 35 USC §119(e)(1) of provisional application numbers 60/227,488 filed Aug. 24, 2000.

BACKGROUND AND SUMMARY OF THE INVENTION

The present invention relates to fabrication of semiconductor devices, and in particular to optical proximity correction of distortions that occur during photolithography.

BACKGROUND: PHOTOLITHOGRAPHY

Optical lithography, or photolithography, is an important means of IC production. The demise of optical lithography for wafer fabrication has been predicted repeatedly, but has never come about. The engineering problems arising in optical lithography are continually addressed and overcome, which contributes to the longevity of the art. As reticle and wafer feature sizes shrink to the submicron level, photolithography faces new engineering problems. Optical proximity correction has been developed to deal with the diffraction and interference effects that occur during the process, but this method of correction faces its own problems, as will be discussed below.

Photolithography is a photographic process used to place patterns for features on a flat wafer surface. A primary component of the photolithographic process is the reticle. A reticle is made from a transparent plate covered with a pattern of material that is opaque to the particular wavelength(s) of radiation used. The pattern corresponds to the features for a specific layer of the integrated circuit design.

A reticle is typically made by exposing, or writing, the required circuit pattern in a resist layer spun on top of a chromium layer. The resist is developed, forming the pattern which serves as a mask for etching the pattern into the chrome layer. The resist layer is then removed. Mask features are usually measured for accuracy and tolerance, then cleaned.

In recent years reticles have become a critical part of the photolithography process because of the need for and difficulty in obtaining smaller and smaller pattern specifications. These tolerances can measure in the tens of nanometers, and pattern data volume is often measured in gigabytes. Reticle pattern errors that were once considered insignificant, such as proximity effects, resist heating during pattern generation, and feature displacement due to gravitational effects on the mask substrate, are now significant parts of photomask fabrication.

In the photolithography process, the reticle is placed between the radiation source and the wafer. During exposure, the radiation is directed through the reticle, which projects the pattern onto the surface of the wafer. This transfers the pattern from the reticle to the wafer surface.

The wafer surface is covered with a photosensitive material (called a photoresist, or resist). To transfer a pattern, the radiation must strike a photosensitive material, and it must change the properties of that material in such a way that a replica of the mask is left on the surface of the wafer after the photolithography process is complete.

A resist generally contains a photoactive compound (PAC) that changes properties after exposure to light. For instance, in a positive resist, the PAC acts as an inhibitor before exposure that slows the rate at which the resist dissolves when placed in developing solution. After exposure, the PAC becomes a sensitizer, increasing the rate at which the resist dissolves in developer.

Positive resist materials thus become more soluble when exposed to light. When developed, the exposed regions are removed, leaving the pattern corresponding to the opaque regions of the reticle. Negative resists become less soluble when exposed, and leave a pattern corresponding to the transparent regions of the reticle.

Whichever type of resist material is used, a mask pattern is left on the wafer after developing. The remaining mask is used to etch the underlying layer, transferring the original pattern to the intended wafer layer. The resist layer is then removed.

Recently there has been some attempt to develop optical proximity correction (OPC) for the mask writers. The mask manufacturers apply some form of correction to the desired pattern so that what is produced on the reticle is closer to what was originally designed. These attempts at correction take into account the distortions inherent in the reticle manufacturing process, which are caused by optical and lithographic effects, and etch and development properties of the resist used to make the reticle.

BACKGROUND: OPTICAL PROXIMITY CORRECTION

As device sizes reach the submicron level, optical proximity effects cause distortion in the wafer patterns. Though these effects have always been present, they did not pose a problem with larger scale devices. However, as features shrink to sizes near the wavelength of radiation used in photolithography, diffraction and other optical effects become more important and can wreak havoc with designs. Designers can compensate for these effects with optical proximity correction, a technique that pre-distorts design patterns to compensate for systematic distortion introduced during fabrication.

OPC involves modification to the design pattern to compensate for changes in feature shape and size that occur during pattern transfer from the reticle to the wafer. When the pattern is transferred from the reticle to the wafer, several effects introduce distortion into the pattern. These distortions include line-width variations dependent on pattern density, corner rounding, and line-end shortening. The changes to the pattern can create bad connections or cause devices to operate at less than optimal speed. Causes for the distortion include reticle pattern infidelity, optical proximity effects, diffraction and interference, and diffusion and loading effects during resist and etch processing.

OPC makes small changes to the IC pattern that are designed to anticipate and correct for these distortions. For instance, line end shortening is corrected by extending the line using a hammerhead shape that results in a line in the resist that more closely resembles the originally intended layout. Corner rounding is corrected by adding (or subtracting) serif shapes from corners. Determining exactly what corrections to make is an extremely complicated process that depends on neighboring geometries and process parameters.

Two current methods for calculating the required corrections are the rule-based and model-based approaches. The rule-based approach uses a lookup table to determine a correction bias for the pattern. Spacing between features and feature sizes and shapes are measured, which correspond to a particular degree of correction in the lookup table. A rule-based approach is simpler to implement and the changes to the pattern are easier to control. However, certain situations may not be represented in the rules and improper corrections may be made.

Model-based approaches use an iterative distortion of the design pattern. A model predicts the effects of the distortions occurring during wafer patterning, and modifies the design pattern to correct for these distortions. The pattern that would result from the modified design pattern is then modeled and compared to the desired pattern. This process typically undergoes several iterations until the modified pattern produces a result that matches the input pattern. A model based approach can usually cover all situations, but is generally slower to correct because of the required iterative process.

Modeling offers a way to characterize and systematically quantify relationships in optical lithography. Modeling and computer simulation often make fabrication efforts much more effective, and feedback from fabrication facility work can in turn improve modeling.

Lithography models simulate the basic steps of image formation, resist exposure, post-exposure bake diffusion, and development to obtain a final resist profile. Simulation consists of representing physical interactions within the lithography process using mathematical equations. More details on modeling and photolithography can be found in the Handbook of Microlithography, Micromachining, and Microfabrication (P. Rai-Choudhury, ed., SPIE Optical Engineering Press, 1997), which is hereby incorporated by reference.

FIG. 1 shows an example of a model based OPC approach. A starting design pattern is input into a wafer pattern model that predistorts the design pattern to compensate for changes that will occur to the pattern during transfer from the reticle to the wafer (Step 1). This produces a Wafer Pattern Image (Step 2), which is compared to the reference pattern (Step 3). If the design criteria are met (meaning the pattern resulting in the wafer sufficiently resembles the intended pattern) then the process ends (Step 4). If not, then the pattern is modified in order to account for differences between the wafer pattern image and the intended pattern (Step 5). This results in a modified design pattern (Step 6), which is used as the new input to the Wafer Pattern Model (Step 7). The process repeats until the Wafer Pattern Image sufficiently resembles the reference pattern.

Though OPC has addressed many engineering problems that arise in photolithography, the advancement of the art has brought on new problems due to the ever decreasing size requirements. At present, OPC, mask pattern pre-processing, and reticle inspection are handled separately with little if any interaction between these three essential processes. In each there is some processing of pattern data to account for limitations in the particular process. It is therefore an object of the presently disclosed innovations to improve the quality of OPC in general, and specifically to improve the proximity correction process, design pattern verification, and reticle inspection.

Improved Optical Proximity Correction

The present application discloses various improvements to the OPC process. In particular, the optical proximity correction process is improved by modeling the changes caused during the transfer of the design pattern to the reticle (called a mask patterning model) and incorporating this model in the OPC. The resulting innovative OPC comprehends the limitations of the mask writing tool and produces a pattern that is optimized for both the mask writing process and the wafer lithography process. The final pattern produced by this improved process will create a modified design pattern that will produce the desired pattern on the wafer, rather than a pattern which will have uncorrected distortion by the time it appears on the reticle.

Verification of the modified design pattern is improved by applying the mask patterning model and the wafer patterning model to the verification process. The mask patterning model and the wafer patterning model are successively (or simultaneously) applied to the modified design pattern, which produces a pattern which can be checked with existing design rules, rather than generating a new set of rules for comparison. The pattern generated by the innovative process (called a wafer pattern image) can be converted to layout data and checked with existing or slightly modified design rules. Alternatively, the wafer pattern image can be compared directly to the reference layer of the wafer design.

Finally, the reticle inspection process is improved by incorporating the limitations of the inspection tool itself into the reticle inspection process. The mask patterning model and a model comprehending the limitations of the inspection tool are applied to the modified design pattern to produce a reticle inspection image. Rather than comparing the reticle to the pattern used to write the reticle, which would necessarily generate defects due to unaccounted for errors in reticle manufacturing and inspection tool limitations, the reticle is compared to a reticle inspection image. This image may also be converted to a layout file for comparison with the reticle. This allows the inspection tool to be used at its highest resolution to catch real defects, while modifications added to correct for defects arising in the reticle manufacturing process are accounted for by the mask patterning model, and inspection tool limitations are accounted for by the mask inspection model. Thus if the pattern was written correctly, the inspection will find no faults.

The disclosed innovations, in various embodiments, provide one or more of at least the following advantages:

the optical proximity correction process integrates the reticle manufacturing process, producing a pattern that compensates for errors introduced not only in the wafer fabrication steps, but also the reticle fabrication steps;

the modified design pattern verification can be performed using the usual or only slightly modified design rules;

reticle inspection tools can be used at their highest resolution;

the reticle inspection process comprehends the limitations of the inspection tool.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

There are three main parts to the present improvements to OPC. First, design pattern correction is improved. Second, design pattern verification is improved. Third, reticle inspection is improved.

Design Pattern Correction

The method of applying optical proximity correction is improved by adding a Mask Patterning Model to the OPC process. The Wafer Patterning Model only accounts for errors introduced to the pattern arising during transfer of the pattern from the reticle to the photoresist or the wafer itself. By adding the Mask Patterning Model, errors introduced to the pattern during transfer of the pattern to the reticle are included in the OPC. The process therefore comprehends the limitations of the mask writing tool and wafer fabrication, producing a pattern optimized for both the mask writing process and the wafer lithography process.

Figure 1:
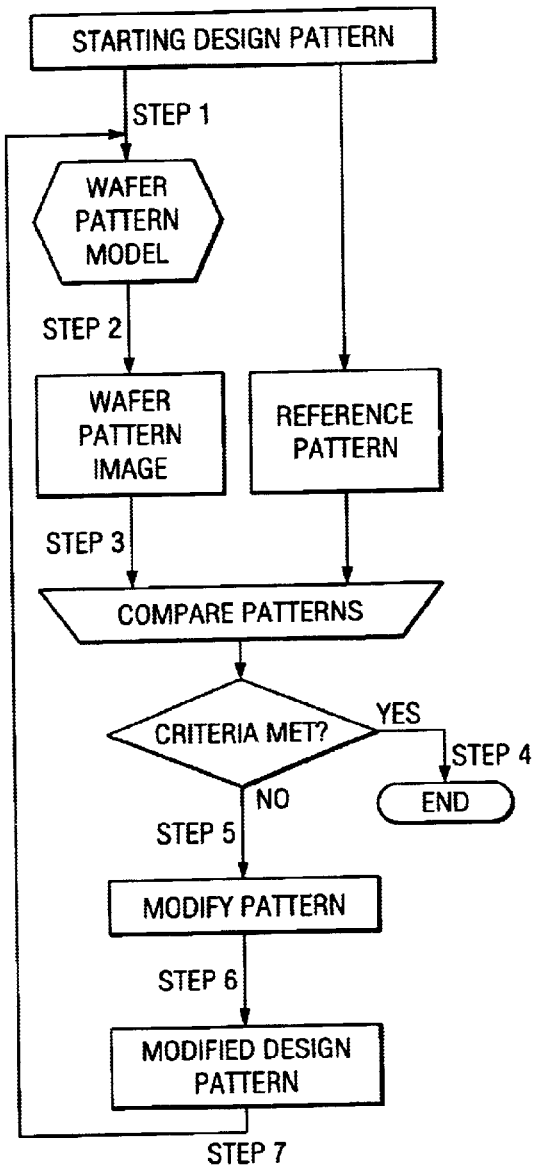
FIG. 1 shows a prior art OPC process.
Figure 2:
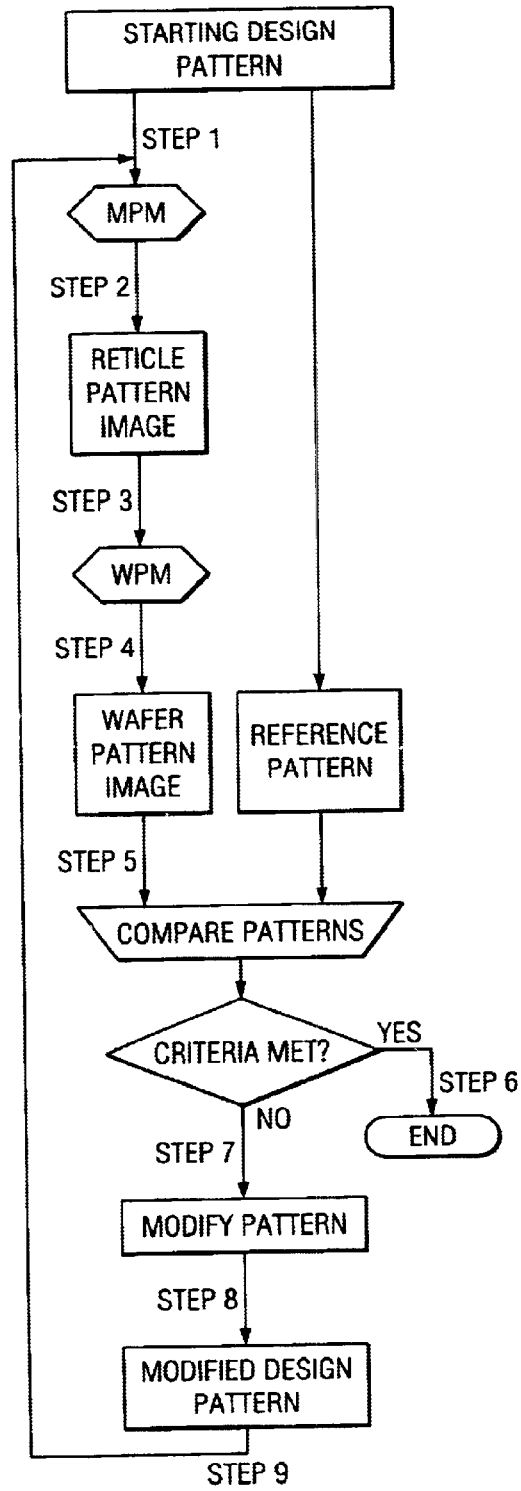
FIG. 2 shows an improved OPC process including the Mask Patterning Model.

FIG. 2 shows a flow of a model-based approach that would include both a Mask Patterning Model and a Wafer Patterning Model. In Step 1 the design pattern is operated on by the MPM, which simulates how the input design pattern transfers to the reticle. This produces a Reticle Pattern Image (Step 2), which is an estimate of what the reticle will actually look like given the changes that occur to the pattern during transfer to the reticle. In Step 3 the Reticle Pattern Image is input to the Wafer Patterning Model, which simulates how the pattern is transformed when transferred to the photoresist and to the wafer layer itself. This produces the Wafer Pattern Image (Step 4), an estimate of what the pattern will actually look like on the wafer. In Step 5 the Wafer Pattern Image is compared to a reference pattern (usually the original design pattern). If the comparison criteria are met, then the Wafer Pattern Image sufficiently resembles the desired pattern and the process ends (Step 6). If not, then the patten is modified (Step 7) so that the pattern will produce an image that more closely resembles the desired pattern. The resulting pattern is the Modified Design Pattern (Step 8). The Modified Design Pattern is input to the MPM again (Step 9), and the process undergoes another iteration.

The Mask Patterning Model is a set of math operators that (theoretically or experimentally) characterizes the actual behavior of the mask writing system. This includes (but is not limited to) lithographic and optical properties of the resist used in the mask write, development, and one or more etches used to produce a mask from the originally supplied data.

The WPM is a similar model that characterizes the wafer fabrication process, including, for example, optical effects, development of the photoresist, and etch of the wafer layer itself. The specific form of these models and their complexity can vary greatly, as is known to those of skill on the art. More information on these kinds of models can be found in Proceedings of SPIE, Vol. 3051, pp. 469–478 (1997), by J. P. Stirniman and M. L. Rieger, and references cited therein, which are hereby incorporated by reference.

Figure 3:
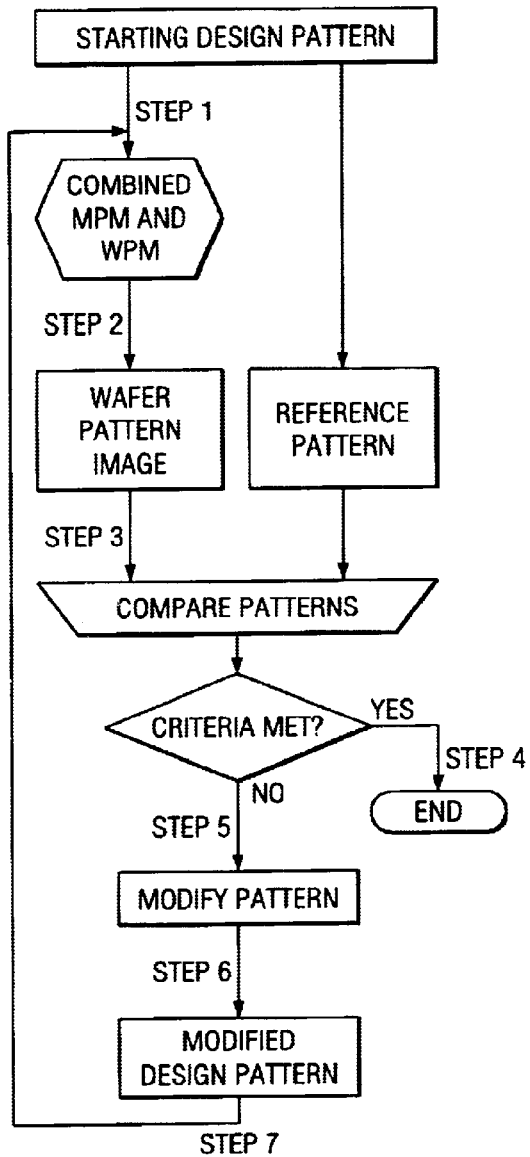
FIG. 3 shows an improved OPC process with the Mask Patterning Model combined with the Wafer Patterning Model.

These models can be combined into one single model that accounts for all possible changes that might occur, starting with the manufacturing of the reticle through the final fabrication of the wafer layer. Such an implementation is shown in FIG. 3. Of course, the interim Reticle Pattern Image is omitted in the combined model process. In Step 1, the starting design pattern is input to the combined MPM and WPM, which model the transfer of the pattern to the reticle and to the wafer. This produces the Wafer Pattern Image (Step 2). The Wafer pattern Image is compared to the reference pattern (Step 3), and if the criteria are met, the process ends (Step 4). If the design criteria are not met, the pattern is modified (Step 5), producing the Modified Design Pattern (Step 6). The Modified Design Pattern is then input to the combined MPM and WPM (Step 7), and the process repeats.

Figure 4:
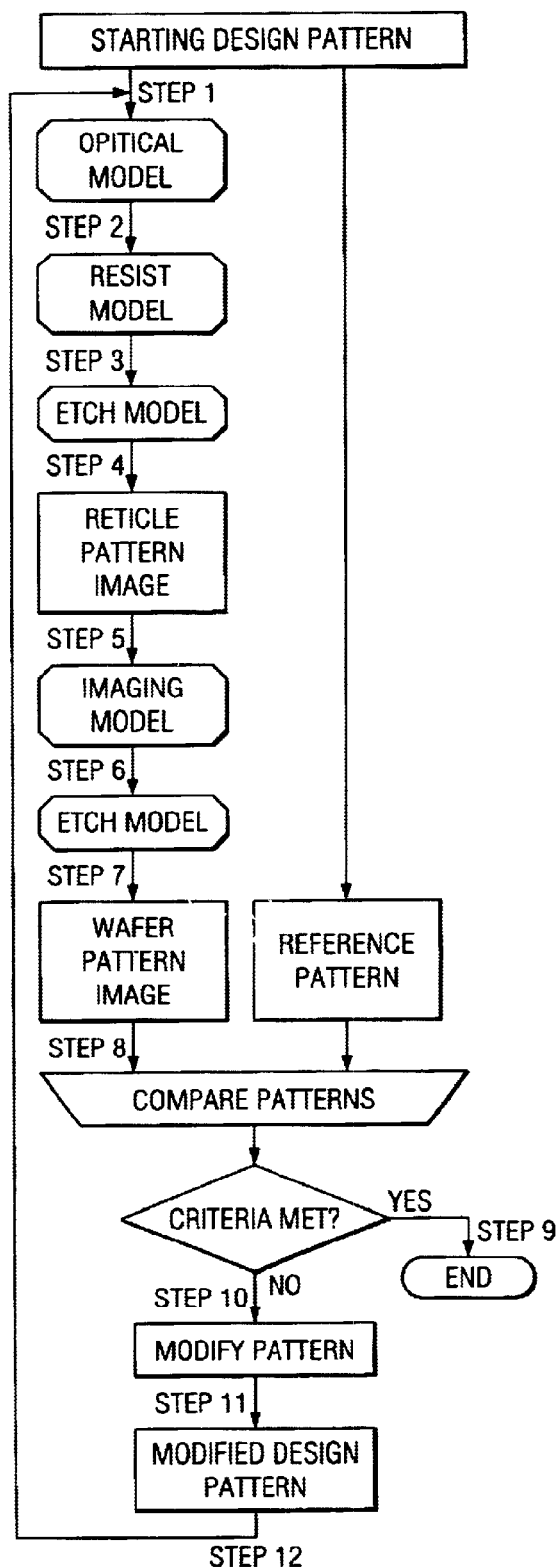
FIG. 4 shows an improved OPC process with detailed models of both the reticle fabrication and transfer process and the wafer fabrication and transfer process.

Likewise, the models can be subdivided into smaller, more detailed models if accuracy demands. For example, the Wafer Patterning Model can be divided by inserting separate "Imaging" and "Etch" models. The Mask Patterning Model can also be further detailed by using separate "Optical," "Resist," and "Etch" models, for example. FIG. 4 shows a process flow for a subdivided MPM and WPM correction process.

The process begins by inputting the starting design pattern to the Optical Model (Step 1), then the Resist Model (Step 2), then the Etch Model (Step 3). These produce a Reticle Pattern Image (Step 4) which is input to the Imaging Model (Step 5) and then the second Etch Model (Step 6) which models the wafer etching process. This produces the Wafer Pattern Image (Step 7), which is compared to the Reference pattern (Step 8). If the design criteria are met, the process ends (Step 9). If not, then the starting design pattern is modified (Step 10), producing a Modified Design Pattern (Step 11). This is put back into the Optical Model (Step 12) and the process repeats.

Comparison of images is accomplished by software tools that convert images to design geometries. Features are represented by polygons with coordinate locations for vertices. The design rules check to ensure that the locations of shapes and features will allow proper circuit functioning and are within manufacturing margins of error. Examples of design rule checkers include software packages like Chameleon from K2 Technologies Inc., and Hercules from Avanti Corporation.

Verification of the Modified Design Pattern

Normally, Modified Design Patterns are verified by design rule checking. However, this method is difficult because the Modified Design Pattern is not a physical pattern intended to end up on a wafer, but rather is a predistorted pattern intended to produce the desired pattern in the wafer by overcoming the various changes that will occur during processing. Thus the MDP differs from both the intended design pattern and from the final wafer pattern. The normal design rules will therefore not match the Modified Design Pattern, even if it is correct. The usual method of design rule checking therefore requires substantial changes to the design rules, or false defects will result.

The present application teaches that by applying the MPM and WPM to the Modified Design Pattern, corrections to the desired pattern (producing the Modified Design Pattern) are accounted for, and the normal design rules are less likely to indicate false defects.

The MPM is applied to the Modified Design Pattern to account for changes that occur during transfer of the pattern to the reticle. This produces the Reticle Pattern Image, or what the Modified Design Pattern would actually look like after transfer to the reticle. The Wafer Pattern Model is applied to the Reticle Pattern Image, simulating how the pattern on the reticle will be transformed when transferred to the photoresist. This produces the Wafer Pattern Image (what the pattern on the photoresist will actually look like).

There are two possibilities for completing the validation process from this point.

In the first option, the Wafer Pattern Image is converted to layout geometry, creating the Wafer Pattern Layout. This Wafer Pattern Layout can then be verified by the design rule checker (using the design rules that are derived from the original set of design rules) or layout verification tools. The rules used for checking this file would not be the design rules exactly, but would be a slightly looser set of rules derived from the design rules. Some of the differences between the original design rules and the looser set of design rules could include differences arising from the fact that lines and spaces in OPC solutions are plotted according to a grid, resulting in small percentage deviations from the strict design rules; limits to the sizes of segments and distances that segments can be moved; and differences in gate positions or sizes when retargeting is done.

Figure 5:
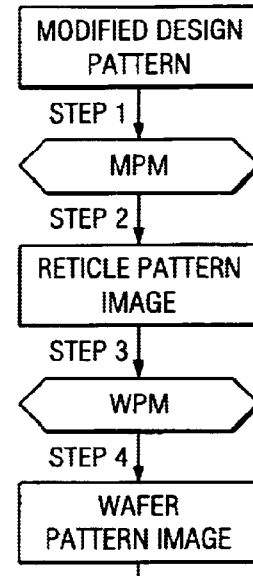
FIG. 5 shows an improved process for validation of the Modified Design Pattern.

FIG. 5 shows the process flow for the improved Modified Design Pattern Verification.

In Step 1, the Modified Design Pattern is input to the MPM. This produces the Reticle Pattern Image (Step 2). This is input to the WPM (Step 3), and produces the Wafer Pattern Image (Step 4). This image is converted to layout data (Step 5), resulting in the Wafer Pattern Layout (Step 6). Finally, the Wafer Pattern Layout is verified by the Design Rule Checker (Step 7). If the design rules are met, the process ends (Step 8). If not, an error is generated (Step 9).

Figure 6:
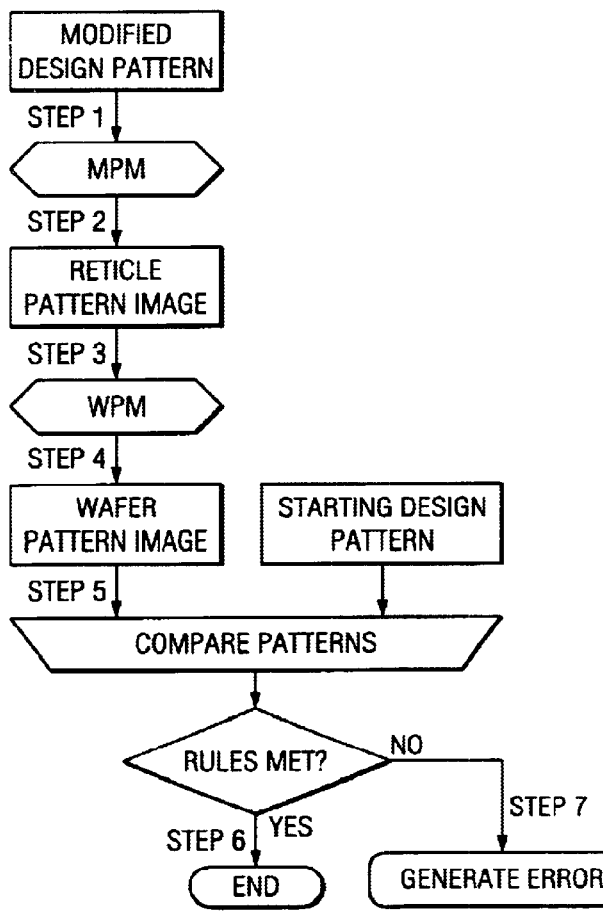
FIG. 6 shows an improved process for validation of the Modified Design Pattern without conversion to layout geometry.

Another option is to forego conversion of the Wafer Pattern Image to layout geometries, and simply compare the Wafer Pattern Image to the starting design pattern. This would save the need to convert the Wafer Pattern Image to layout data, but would require doing rule checking with something other than existing layout verification tools. The process would resemble the OPC process, except that no iterative modification would take place. Only an error generation process would exist for generating an error when the Wafer Pattern Image violated some rule. FIG. 6 shows the process flow for this embodiment.

In Step 1, the Modified Design Pattern is input to the MPM. This produces the Reticle Pattern Image (Step 2). This is input to the WPM (Step 3), and produces the Wafer Pattern Image (Step 4). The Wafer pattern Image is directly compared to the Starting Design Pattern (Step 5). If the design rules are met, the process ends (Step 6). If not, then an error is generated (Step 7).

Alternatively, the MPM and the WPM can be combined into a single model, or further divided into more detailed models as accuracy requires. Possible alternative models are discussed above with respect to the improved optical proximity correction process.

Reticle Inspection

The current state of the art in reticle manufacturing is such that mask houses can pattern features on reticles that are too small to be successfully inspected by current mask inspection tools. Though the resolution of these tools is improving, the resolution gains have not kept pace with the decrease in size of reticle features, especially those produced by OPC.

Current methods of inspecting reticles in the die-to-database mode face significant problems because of limitations in both the mask making process and the inspection tools. First, the pattern that the mask writing tool attempts to write is not what ends up on the reticle. So even an inspection tool with excellent resolution will find fault with the reticle pattern as written when comparing back to the design data. Next, the inspection tools do not have the resolution to successfully image features that do end up on the wafer. Thus the mask manufacturer is faced with two options: (1) use the inspection tool in a lower resolution mode where the poorly imaged fine features on the mask are ignored, which risks missing real defects; or (2) use the inspection tool at high resolution and live with the torrent of defects that result from the fine features on the mask, resulting in increased inspection time.

Figure 7:
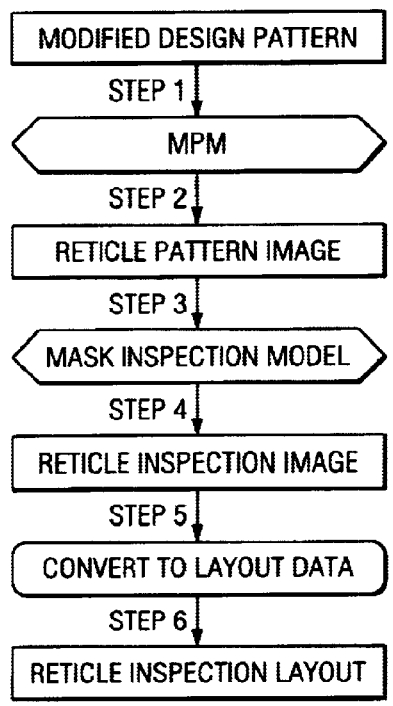
FIG. 7 shows an improved reticle inspection process.

The present application discloses using a model of the optics of the inspection tool to comprehend the limitations of the tool. For instance, if the inspection tool uses an optical microscope to view the reticle, then the model would involve aerial image simulation and a model of the image sensor. Whatever the form of the model, called the Mask Inspection Model (MIM), the intention is to use such a model in conjunction with the Mask Patterning Model (MPM) in a scheme such as shown in FIG. 7.

The purpose of these two models (the MPM and the MIM) is to simulate the processes of patterning the reticle and viewing the reticle through a particular inspection tool. The Modified Design Pattern is input to the MPM (Step 1), which simulates how the pattern transfers to the reticle. This produces the Reticle Pattern Image (Step 2), an estimate of what the reticle will actually look like, accounting for transfer changes caused in the reticle writing process. The Reticle Pattern Image is input to the MIM (Step 3), which simulates the image that the inspection tool detects on the reticle by accounting for the limitations of the inspection tool. This produces the Reticle Inspection Image (Step 4). The Reticle Inspection Image is converted to layout data (Step 5), creating the Reticle Inspection Layout (Step 6). The resulting layout file is used for inspection instead of inspecting the pattern that is used to actually write the reticle. Thus, the mask inspection tool compares the reticle that it is inspecting to the Reticle Inspection Layout Pattern. The Layout Pattern has explicitly accounted for errors in the inspection tool, and thus if the reticle was correctly written, the inspection will find no fault.

The invention simulates both the mask patterning process and the inspection process to produce a pattern file that is used in the die-to-database inspection. This allows the inspection tool to be used at its best resolution for finding actual defects while the fine features that were in the mask pattern file and were actually written correctly on the mask will look like what is in the inspection database pattern. The process requires reasonably accurate models of the mask patterning process and the inspection imaging process.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

Wafer Patterning Model: WPM is used to simulate how a specific pattern on the reticle is transformed when it is transferred to the photoresist, or in some cases to another material on the wafer such as a polysilicon layer.

Mask Patterning Model: MPM simulates how a specific pattern transfers to the reticle.

Mask Inspection Model: MIM simulates the image that a mask inspection tool would see on the reticle.

Modified Design pattern: The intended design pattern after it has been predistorted by the OPC process.

Design Pattern: The pattern intended to appear on the wafer, without corrections for distortion.

Reticle: The patterned substrate containing one or more copies of the chip pattern. Used interchangeably with "mask."

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Though the present application describes correction to the image process for optical proximity correction, the innovative aspects of these teachings could be applied to other complex image processing systems, including image transfer processes with an intermediate step. For example, where discrete line images are resolved by grayscaling to create a clearer image, comprehension of the limitations of the scaling instruments might be implemented in the process to improve it.

The models used in the present innovations could be of many forms, and in some embodiments could themselves include not only distortions inherent in the particular process modeled, but also corrections or estimations of those distortions.

Additional general background, which helps to show the knowledge of those skilled in the art regarding the system context, and of variations and options for implementations, may be found in the following publications, all of which are hereby incorporated by reference. In particular, many details may be found in the various volumes of the SPIE Proceedings on Microlithography, and in Principles of Optics: Electromagnetic Theory of Propagation, Interference, and Diffraction of Light, by Born and Wolf, Cambridge University Press (1999), all of which are hereby incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A method of optical proximity correction, comprising the actions of:
    modeling the transfer of a design pattern to a reticle, to thereby produce a reticle pattern image;
    modeling the transfer of said reticle pattern image to a wafer, to thereby produce a wafer pattern image;
    generating a comparison of said wafer pattern image and a reference pattern; and
    modifying said design pattern if said step of generating a comparison fails to satisfy a set of design rules.

2. The method of claim 1, wherein said action of modeling the transfer of a design pattern to a reticle includes generating math operators that characterize the behavior of the mask writing system.

3. The method of claim 1, wherein said action of modeling the transfer of said reticle pattern image to a wafer includes generating math operators that characterize the behavior of the wafer fabrication process.

4. The method of claim 1, wherein said action of generating a comparison is accomplished with software tools that convert images to design geometries.

5. A method of validating a modified design pattern in optical proximity correction, comprising the actions of:
    modeling the transfer of said modified design pattern to a reticle, to thereby produce a reticle pattern image;
    modeling the transfer of said reticle pattern image to a wafer, to thereby produce a wafer pattern image; and
    generating a comparison of said wafer pattern image and a reference pattern.

6. The method of claim 5, wherein said action of modeling the transfer of said modified design pattern to a reticle includes generating math operators that characterize the behavior of the mask writing system.

7. The method of claim 5, wherein said action of modeling the transfer of said reticle pattern image to a wafer includes generating math operators that characterize the behavior of the wafer fabrication system.

8. The method of claim 5, wherein said action of generating a comparison is accomplished with software tools that convert images to design geometries.

9. The method of claim 5, further comprising the action of modifying said design pattern if said comparison fails to satisfy a set of design criteria.

10. A method of inspecting a reticle in optical proximity correction, comprising the actions of:
    modeling the transfer of a design pattern to a reticle, to thereby produce a reticle pattern image;
    modeling how said reticle pattern image will be resolved by a mask inspection tool, to thereby produce a reticle inspection image;
    generating a comparison of said reticle and said reticle inspection image.

11. The method of claim 10, wherein said action of modeling the transfer of a design pattern to a reticle includes generating math operators that characterize the behavior of the mask writing system.

12. The method of claim 10, wherein said action of modeling how said reticle pattern image will be resolved includes generating math operators that characterize the behavior of the reticle inspection tool.

13. The method of claim 10, wherein said action of generating a comparison is accomplished with software tools that convert images to design geometries.

14. The method of claim 10, further comprising the action of modifying said design pattern if said comparison fails to satisfy a set of design criteria.

15. A method of correcting design patterns for wafer fabrication, comprising the actions of:
    correcting for changes in said design pattern occurring during transfer of the pattern to the reticle; and
    correcting for changes in said design pattern occurring during transfer of the pattern to the wafer.

* * * * *